(12) United States Patent
Nagano et al.

(10) Patent No.: US 6,797,079 B2
(45) Date of Patent: Sep. 28, 2004

(54) PHYSICAL VAPOR DEPOSITION TARGET

(75) Inventors: Shozo Nagano, Kanagawa (JP);
Hinrich Hargarter, Ijmuiden (NL);
Jianxing Li, Spokane, WA (US); Jane Buehler, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/783,835

(22) Filed: Feb. 14, 2001

(65) Prior Publication Data

US 2001/0035238 A1 Nov. 1, 2001

Related U.S. Application Data

(62) Division of application No. 09/449,025, filed on Nov. 24, 1999, now abandoned.

(51) Int. Cl.[7] ............................................. C23C 14/00
(52) U.S. Cl. ....................................... 148/432; 420/495
(58) Field of Search ................................ 148/432–436; 420/495

(56) References Cited

U.S. PATENT DOCUMENTS

| | | | |
|---|---|---|---|
| 4,786,469 A | * 11/1988 | Weber et al. | |
| 5,023,698 A | 6/1991 | Kobayashi et al. | 357/67 |
| 5,590,389 A | * 12/1996 | Dunlop et al. | |
| 5,719,447 A | 2/1998 | Gardner | |
| 5,833,820 A | 11/1998 | Dubin | 204/212 |
| 5,895,562 A | 4/1999 | Dubin | 205/137 |
| 5,972,192 A | 10/1999 | Dubin et al. | |
| 6,162,726 A | 12/2000 | Dubin | 438/678 |

FOREIGN PATENT DOCUMENTS

| | | |
|---|---|---|
| EP | 0 335 383 A2 | 3/1989 |
| EP | 0 626 722 A1 | 2/1993 |
| JP | 49007777 | * 2/1974 |
| WO | WO 00/73531 A2 | 12/2000 |

OTHER PUBLICATIONS

Massalski, 18 Binary Alloy Phase Diagrams 18–19, 928–929, 936–937, 964–965 (1986).
Electromigration Properties of Copper–Zirconium alloy Interconnects, Y. Igarashi et al., *J. Vac. Sci. Technol. B 16(5)*, Sep./Oct. 1998, p. 2745–2750.
Directional and Preferential Sputtering–Based Physical Vapor Deposition, S.M. Rossnagel, *1995 Elsevier Science S.A., p. 1–12.*

(List continued on next page.)

*Primary Examiner*—Sikyin Ip
(74) *Attorney, Agent, or Firm*—Wells St. John P.S.

(57) ABSTRACT

A physical vapor deposition target includes an alloy of copper and silver, with the silver being present in the alloy at from less than 1.0 at % to 0.001 at %. In one implementation, a physical vapor deposition target includes an alloy of copper and silver, with the silver being present in the alloy at from 50 at % to 70 at %. A physical vapor deposition target includes an alloy of copper and tin, with tin being present in the alloy at from less than 1.0 at % to 0.001 at %. In one implementation, a conductive integrated circuit metal alloy interconnection includes an alloy of copper and silver, with the silver being present in the alloy at from less than 1.0 at % to 0.001 at %. A conductive integrated circuit metal alloy interconnection includes an alloy of copper and silver, with the silver being present in the alloy at from 50 at % to 70 at %. A conductive integrated circuit metal alloy interconnection includes an alloy of copper and tin, with tin being present in the alloy at from less than 1.0 at % to 0.001 at %. Other useable copper alloys include an alloy of copper and one or more other elements, the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, Te, V, Nb, Ta, Cr, Mo, W, Mn, Tc, Re, Fe, Ru, Os, Co, Rh, Ni, Pd, Pt, Au, Tl, and Pb. An electroplating anode is formed to comprise one or more of the above alloys.

13 Claims, 2 Drawing Sheets

OTHER PUBLICATIONS

Excellent Electro/Stress–Migration–Resistance Surface–Silicide Passivated Giant–Grain Cu–Mg alloy Interconnect Technology for Giga Scale Integration (GSI), T. Takewaki et al., 1995 IEEE, p. 95-253-95-256.

Materials Issues in Copper Interconnections, J.M.E. Harper, et al., *MRS Bulletin/Aug. 1994*, p. 23–29.

Preparation of Low Resistivity Cu–1 at. %Cr Thin Films by Magnetron, C. Cabral, Jr., et al., *Journal of the Institute of Metals*, Jun. 1951, p. 185–208.

International Critical Tables of Numerical Data, Physics, Chemistry and Technology, *National Research Council of the United States of America*, vol. I–VII, 1933, 6 pages.

* cited by examiner

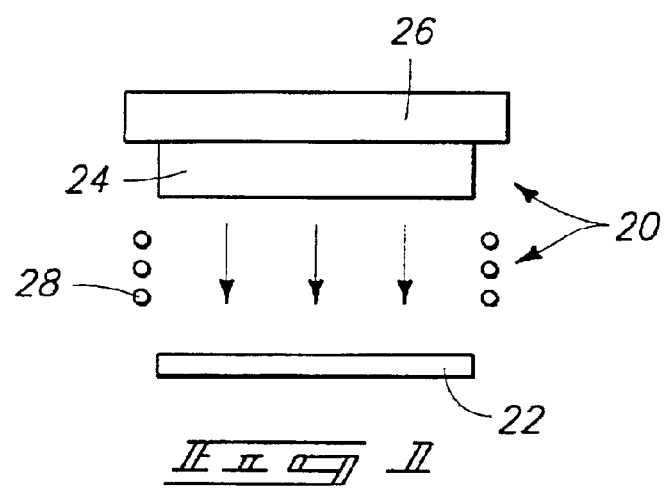
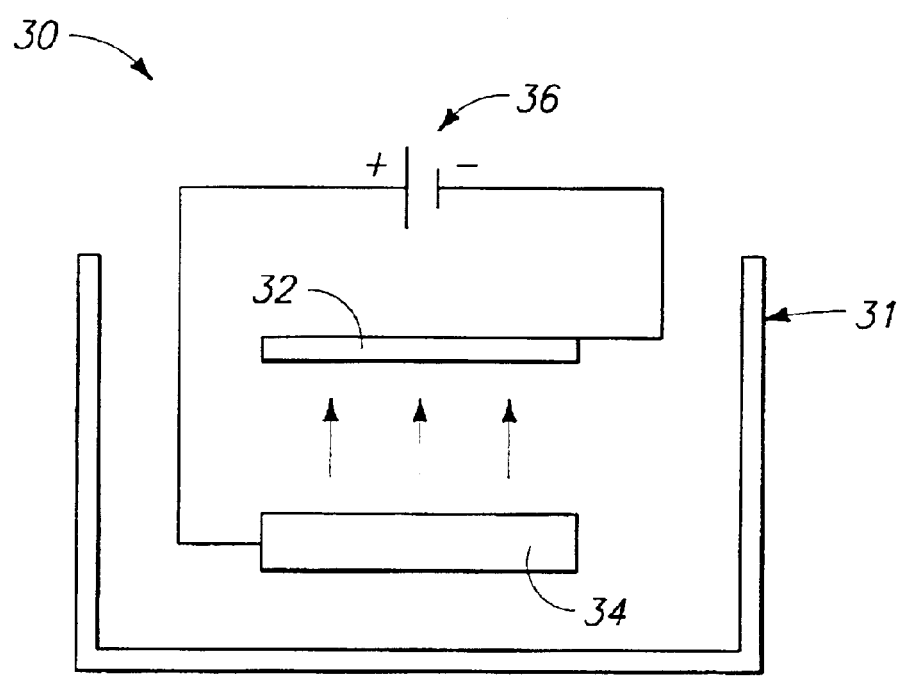

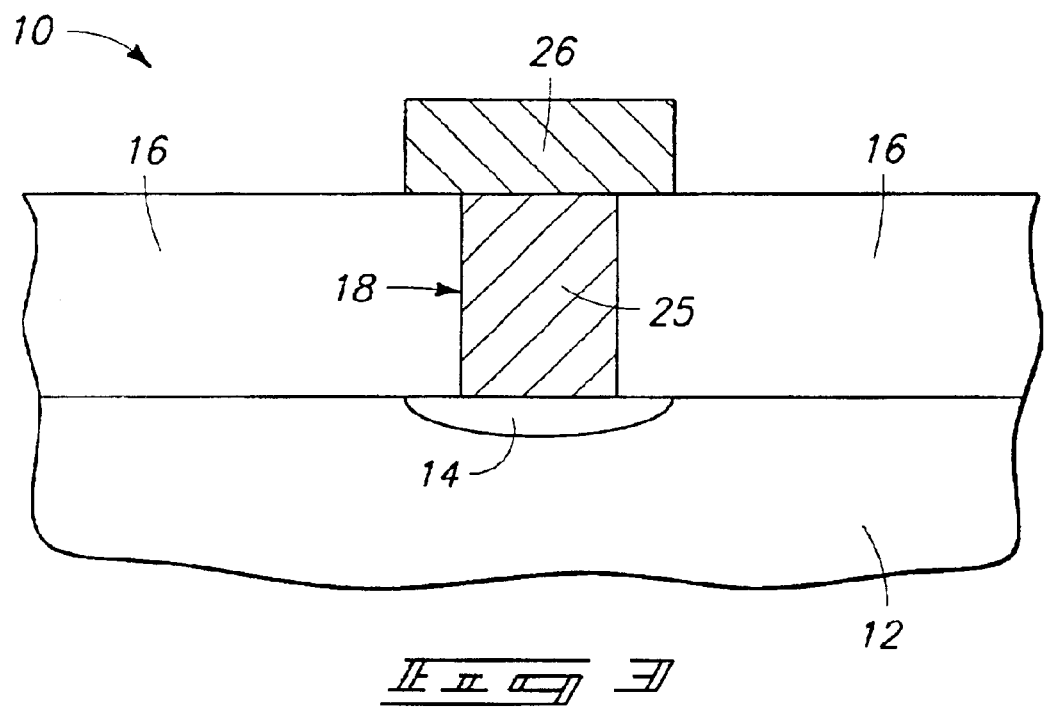

PHYSICAL VAPOR DEPOSITION TARGET

RELATED PATENT DATA

This patent resulted from a divisional application of U.S. patent application Ser. No. 09/449,025, filed Nov. 24, 1999 now abandoned, entitled "Physical Vapor Deposition Targets, Conductive Integrated Circuit Metal Alloy Interconnects, Electroplating Anodes, and Metal Alloys For Use as a Conductive Interconnection in an Intergrated Circuit", naming Shozo Nagano, Hinrich Hargarter, Jianxing Li and Jane Buehler as inventors, the disclosure of which is incorporated by reference.

TECHNICAL FIELD

This invention relates to physical vapor deposition targets, to conductive integrated circuit metal alloy interconnections, and to electroplating anodes.

BACKGROUND OF THE INVENTION

Aluminum and its alloys are common metal materials used in metal interconnects in the fabrication of integrated circuitry on semiconductor wafers. Yet as circuitry density increases and operating speed increases, aluminum's electrical resistance is expected to prevent its use in many next generation circuits. Copper has been proposed as a strong candidate to replace aluminum and its alloys due to copper's low bulk resistivity of 1.7 microohms.cm at near 100% purity (i.e., greater than 99.999% copper). Further, it has electromigration resistance compared to that of aluminum and its alloys of about 10 times or greater.

One problem associated with pure copper interconnects concerns abnormal grain growth or thermal stability in the deposited film. Further, such abnormal and undesired grain growth can reduce the film's electromigration resistance. Low thermal stability is defined as, and abnormal grain growth is characterized by, a tendency of the individual crystal grains within copper to grow when exposed to a certain temperature. The higher the temperature at which a material recrystallizes or starts to grow larger grains, the higher the thermal stability of the material.

Elemental copper and its alloys can be deposited in integrated circuitry fabrication using a number of techniques, including chemical vapor deposition, physical vapor deposition and electrochemical deposition, such as electroplating. Ideally when deposited, the copper comprising sputtering target will have substantially uniform microstructure, a fine grain size, and preferred crystal orientation in order to achieve desired sputtering performance and resultant thin film formation and properties.

SUMMARY

The invention includes conductive integrated circuit metal alloy interconnections, physical vapor deposition targets and electroplating anodes. In one implementation, a physical vapor deposition target includes an alloy of copper and silver, with the silver being present in the alloy at from less than 1.0 at % to 0.001 at %. In one implementation, a physical vapor deposition target includes an alloy of copper and silver, with the silver being present in the alloy at from 50 at % to 70 at %. In one implementation, a physical vapor deposition target includes an alloy of copper and tin, with tin being present in the alloy at from less than 1.0 at % to 0.001 at %.

In one implementation, a conductive integrated circuit metal alloy interconnection includes an alloy of copper and silver, with the silver being present in the alloy at from less than 1.0 at % to 0.001 at %. In one implementation, a conductive integrated circuit metal alloy interconnection includes an alloy of copper and silver, with the silver being present in the alloy at from 50 at % to 70 at %. In one implementation, a conductive integrated circuit metal alloy interconnection includes an alloy of copper and tin, with tin being present in the alloy at from less than 1.0 at % to 0.001 at %.

In one implementation, an electroplating anode includes an alloy of copper and silver, with the silver being present in the alloy at from less than 1.0 at % to 0.001 at %. In one implementation, an electroplating anode includes an alloy of copper and silver, with the silver being present in the alloy at from 50 at % to 70 at %. In one implementation, an electroplating anode includes an alloy of copper and tin, with tin being present in the alloy at from less than 1.0 at % to 0.001 at %.

In other implementations, other useable copper alloys in physical vapor deposition targets, conductive integrated circuit metal alloy interconnections, and electroplating anodes include an alloy of copper and one or more other elements, the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, Te, V, Nb, Ta, Cr, Mo, W, Mn, Tc, Re, Fe, Ru, Os, Co, Rh, Ni, Pd, Pt, Au, Tl, and Pb. An electroplating anode is formed to comprise one or more of the above alloys.

In other implementations, the invention contemplates metal alloys for use as a conductive interconnection in an integrated circuit.

BRIEF DESCRIPTION OF THE DRAWINGS

Preferred embodiments of the invention are described below with reference to the following accompanying drawings.

FIG. 1 is a diagrammatic sectional view of a physical vapor deposition target system in accordance with an aspect of the invention.

FIG. 2 is a diagrammatic sectional view of an electroplating system incorporating an electroplating anode in accordance with an aspect of the invention.

FIG. 3 is a cross-sectional view of a semiconductor wafer fragment comprising integrated circuitry including a conductive metal alloy interconnection in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention includes novel physical vapor deposition targets comprising alloys of copper and silver, and comprising alloys of copper and tin. The invention also contemplates conductive integrated circuit interconnections comprised of such metal alloys, and whether deposited utilizing the inventive physical vapor deposition targets, by chemical vapor deposition or by other methods. The invention includes electroplating anodes comprising alloys of copper and silver, and comprising alloys of copper and tin. The invention also includes physical vapor deposition targets, conductive integrated circuit interconnections, and electroplating anodes comprising other copper alloys. The invention also contemplates metal alloys for use as a conductive interconnection in an integrated circuit, by way of example only as might be used as raw material for producing physical vapor deposition targets or electroplating anodes.

In one implementation, a physical vapor deposition target comprises an alloy of copper and silver, with the silver being present in the alloy at from less than 1.0 at % to 0.001 at %, and more preferably at from 0.005 at % to 0.1 at %. An aspect of the invention also includes a conductive integrated circuit metal alloy interconnection comprising this alloy of copper and silver. Preferably, such interconnection will have higher electromigration resistance than copper of a purity greater than 99.999% of the same grain size. Further preferably, the alloy will have greater thermal stability to grain size retention and crystal orientation retention than copper of a purity of greater than 99.999% of the same grain size. Further preferably, very near the pure copper electrical conductivity is ideally achieved. Preferably when the interconnection is deposited from a sputtering target, the alloy offers very stable sputtering target microstructure and texture. A thermally stabilized target of this alloy can offer improved sputtering performance and resultant thin film properties within the circuitry. Regardless and when deposited from chemical vapor deposition or other methods, the alloy offers higher electromigration resistance while maintaining very near the pure copper electrical conductivity. Silver can form uniformly fine precipitates in the microstructure in the form of elemental precipitates.

In another aspect of the invention, the physical vapor deposition target comprises an alloy of copper and silver, with silver being present in the alloy at from 50 at % to 70 at %, more preferably at between 55 at % and 65 at %, and most preferably at about 60 at %. The invention also contemplates a conductive integrated circuit metal alloy interconnection comprising this alloy of copper and silver, whether deposited by physical vapor deposition, chemical vapor deposition or other methods. Most preferably, the resultant alloy as formed in the circuit has higher electromigration resistance than copper of a purity of greater than 99.999% of the same grain size. Further preferably, the alloy interconnection preferably has greater thermal stability to grain size retention and crystal orientation retention than copper of a purity of greater than 99.999% of the same grain size.

Silver is a very desirable doping element in copper for physical vapor deposition targets and conductive integrated circuity metal alloy interconnections, as it has a similar electrical resistivity with copper and forms essentially no solid solution with copper. Accordingly, a copper-silver alloy can be largely represented as a mechanical mixture of silver grains and copper grains. Due to this structure and mixture, a copper-silver alloy has minimum electrical resistivity increase over that of pure copper even at high-level silver concentrations. Further, it is reported that the lowest electrical resistivity of copper-silver alloys is close to the eutectic composition, which is at about copper at 40 at %, silver at 60 at %, and is only about 10% above the resistivity of pure copper. Accordingly, a considerably reduced or lower reflow temperature can be achieved using a copper alloy at or about the 60 at % silver eutectic point for the alloy. This will result in a melt temperature of about 780° C., which is considerably lower than a pure copper melt temperature of about 1085° C., and is only about 120° C. above the melt temperature for aluminum and alloys thereof commonly presently used in conductive integrated circuit interconnections. Accordingly, the low-melt temperature of the eutectic alloy presents an opportunity for low temperature reflow after thin film deposition for small via and deep trench-fill applications.

This particular application could have a profound impact on thin film deposition. With the ever shrinking device feature size and integrated circuitry design rules, one of the bottlenecks for thin film deposition is the complete filling of small via and trenches. Pressure or temperature-assisted film deposition has been adopted to leverage the difficulty of small via and trench-fill in aluminum metallization. However, high pressure is not well-compatible with conventional integrated circuitry processes, and therefore has not been very well accepted by the industry. Accordingly, predominantly high temperature processing has been used in most applications. Yet for copper metallization, the temperature-assisted deposition is not expected to be practical due to its high melt temperature. Yet, copper-silver alloys at the preferred composition range between 50 at % and 70 at % silver, and even more preferably at around the eutectic point of 60 at % silver, may provide significant processing advantages in using copper alloys.

In another aspect of the invention, a physical vapor deposition target comprises an alloy of copper and tin, with tin being present in the alloy at from less than 1.0 at % to 0.001 at %, and more preferably at from 0.01 at % to 0.1 at %. An aspect of the invention also contemplates conductive integrated circuitry metal alloy interconnections comprising this alloy. Preferably, such interconnections will have higher electromigration resistance than copper of a purity of greater than 99.999% of the same grain size. Further preferably, such interconnections will have greater thermal stability to grain size retention and crystal orientation retention than copper of a purity of greater than 99.999% of the same grain size. Further preferably, the interconnections will have an electrical resistivity of less than 1.8 microohms.cm. Tin can form uniformly fine precipitates in the microstructure in the form of intermetallic compound precipitates.

A series of copper alloys were prepared using conventional vacuum induction melt and air melt methods. A high purity copper (purity of 99.9998% (5N8)) was used as a reference, as well as the starting material for the copper alloys described above. Different levels of silver and tin were doped into the reference copper to obtain the copper alloys. Chemical analysis was taken from the as-cast samples using glow discharge mass spectroscopy (GDMS). Thermal stability was evaluated using hardness, grain size, and texture (grain orientation) analysis at different temperatures. Electrical resistivity was measured using bulk samples at room temperature.

The detailed results are shown in the tables below, with all ppm values being in weight percent.

| Material | Electrical Resistivity ($\mu\Omega$.cm) |
| --- | --- |
| Pure Cu (5N8) | 1.70 |
| Cu w/16 ppm Sn | 1.71 |
| Cu w/530 ppm Sn | 1.69 |
| Cu w/135 ppm Ag | 1.82 |
| Cu w/145 ppm Ag | 1.75 |
| Cu w/385 ppm Ag | 1.75 |

| Material | Recrystallization Temperature (° C.) |
|---|---|
| Pure Cu (5N8) | 150 |
| Cu w/350 ppm Sn | 250 |
| Cu w/530 ppm Sn | 300 |
| Cu w/145 ppm Ag | 350 |
| Cu w/385 ppm Ag | 400 |

| Material | Grain Size Retention Temperature (° C.) | Texture Retention Temperature (° C.) |
|---|---|---|
| Pure Cu (5n8) | 350 (grain size 30 µm) | 150 |
| Cu w/530 ppm Sn | >400 (grain size 20 µm) | 300 |
| Cu w/385 ppm Ag | >400 (grain size 20 µm) | 400 |

The above reduction-to-practice examples show tin and silver-copper alloys having approximately the same electrical resistivity as pure copper. Further, such copper alloys demonstrate improved thermal stability and refined grain structure.

Both silver and tin have negligible solid solubility in copper at room temperature. Accordingly, almost all of the doped silver and tin preferably precipitates out of the copper matrix once the alloy is solidified. A preferred result is a virtually clean copper matrix with a small amount of silver or $CuSn_3$ intermetallic compounds. Preferably, there is little copper lattice distortion in very small amount of precipitates, leaving the electrical resistivity very close to pure copper. This trend should result where the doping element does not form solid solution with copper, and its amount is less than 1 at % silver or tin.

The invention also contemplates use of other copper alloys in physical vapor deposition targets, conductive integrated circuit interconnections, and electroplating anodes. These materials include elements which have low room temperature solid solubility and uniformly distributed fine precipitates in the microstructure, much like silver and tin. One class of elements forms intermetallic compound precipitates in the microstructure. These include Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, and Te. In accordance with an aspect of the invention, physical vapor deposition targets, conductive integrated circuit interconnections, and electroplating anodes are comprised of an alloy of copper and one or more other elements, with the one or more other elements being present in the alloy at a total concentration from less than 1.0 at % to 0.001 at % and being selected from the group consisting of Be, Ca, Sr, Ba, Sc, Y, La, Ce, Pr, Nd, Pm, Sm, Eu, Gd, Tb, Dy, Ho, Er, Tm, Yb, Lu, Ti, Zr, Hf, Zn, Cd, B, Ga, In, C, Se, and Te. Such copper alloys are expected to have higher electromigration resistance than copper of a purity of greater than 99.999% of the same grain size. Further, such copper alloys are expected to have greater thermal stability to grain size retention and crystal orientation retention than copper of a purity of greater than 99.999% of the same grain size.

Another class of elements forms element precipitates in the microstructure. These include V, Nb, Ta, Cr, Mo, W, Mn, Tc, Re, Fe, Ru, Os, Co, Rh, Ni, Pd, Pt, Au, Tl, and Pb. In accordance with an aspect of the invention, physical vapor deposition targets, conductive integrated circuit interconnections, and electroplating anodes are comprised of an alloy of copper and one or more other elements, with the one or more other elements being present in the alloy at a total concentration from less than 1.0 at % to 0.001 at % and being selected from the group consisting of V, Nb, Ta, Cr, Mo, W, Mn, Tc, Re, Fe, Ru, Os, Co, Rh, Ni, Pd, Pt, Au, Tl, and Pb. Such copper alloys are expected to have higher electromigration resistance than copper of a purity of greater than 99.999% of the same grain size. Further, such copper alloys are expected to have greater thermal stability to grain size retention and crystal orientation retention than copper of a purity of greater than 99.999% of the same grain size.

FIG. 1 diagrammatically depicts a sputtering system comprising a sputtering assembly 20 and a wafer 22 to be sputter deposited upon. Sputtering assembly 20 comprises a main sputtering target 24 adhered to a backing plate 26 by conventional or yet-to-be developed methods. Sputtering assembly 20 also includes an RF sputtering coil 28 received intermediate main target 24 and substrate 22. One or both of main target 24 and RF sputtering coil 28 is fabricated to comprise one or more of the above alloys.

In one aspect, the invention also contemplates use of one or more of the above alloys as an electroplating anode. FIG. 2 diagrammatically depicts but an exemplary electroplating system 30 comprising a liquid reservoir 31. A substrate 32 to be deposited upon and an electroplating anode 34 are received within a suitable plating solution within reservoir 31 opposite one another. Substrate 32 and anode 34 are electrically interconnected with one another through a suitable power source 36 configured to enable substrate 32 to function as a cathode, and thereby deposit material from electroplating anode 34 onto substrate 32.

FIG. 3 illustrates but an exemplary semiconductor wafer fragment indicated generally with reference numeral 10. Such comprises a bulk semiconductive substrate 12 having an electrically conductive diffusion region 14 formed therein. An electrically insulating layer 16 is formed over substrate 12 and a contact opening 18 has been formed therethrough over diffusion region 14. Such has been plugged with an electrically conductive plugging material 25, which preferably comprises one or more of the alloys as described above. Diffusion barrier or adhesion layers (not shown) might also, of course, be utilized relative to contact opening 18. An electrically conductive line 26 has been deposited and patterned over and in electrical connection with conductive plugging material 25. Interconnect line 26 also preferably comprises one or more of the above-described alloys. Components 26 and 25 constitute exemplary conductive integrated circuit metal alloy interconnections preferably comprising one or more of the alloys described herein. Such might comprise different materials as depicted by the different section lines, or constitute the same material throughout. Other constructions are of course contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A physical vapor deposition target made of a copper alloy consisting of copper and one or more other elements, the one or more other elements being present in the alloy at a total concentration from less than 1.0 at % to 0.001 at % and consisting of Tc and optionally one or more member selected from the group consisting of Mo, Re, and Tl.

2. The physical vapor deposition target of claim 1 wherein the one or more other elements are present in the alloy at a total concentration at from 0.005 at % to 0.1 at %.

3. The physical vapor deposition target of claim 1 comprising an RF sputtering coil.

4. The physical vapor deposition target of claim 1 wherein the one or more elements includes Mo.

5. The physical vapor deposition target of claim 1 wherein the one or more elements includes at least two elements.

6. The physical vapor deposition target of claim 1 wherein the one or more elements includes Re.

7. The physical vapor deposition target of claim 1 wherein the one or more elements includes Tl.

8. The physical vapor deposition target of claim 1 wherein the one or more elements form elemental precipitates in the alloy microstructure.

9. The physical vapor deposition target of claim 1 wherein the average grain size is less than or equal to about 20 micrometers.

10. A physical vapor deposition target made of a copper alloy consisting of copper having a purity of 99.9998% and one or more other elements, the one or more other elements being present in the alloy at a total concentration from less than 1.0 at % to 0.001 at % and consisting of Tc and optionally one or more member selected from the group consisting of Mo, Re, Tl.

11. The physical vapor deposition target of claim 10 wherein the copper alloy comprises an average grain size and comprises an electromigration resistance higher than the electromagination resistance of copper having a purity of greater than 99.999% of the same average grain size.

12. The physical vapor deposition target of claim 10 wherein the copper alloy comprises an average grain size and comprises a thermal stability to grain size retention that is higher than the thermal stability to grain size retention of copper having a purity of greater than 99.999% of the same average grain size.

13. The physical vapor deposition target of claim 10 comprising three or fewer of the other elements.

* * * * *